US009233841B2

(12) United States Patent
Heuck et al.

(10) Patent No.: US 9,233,841 B2
(45) Date of Patent: Jan. 12, 2016

(54) PRODUCTION PROCESS FOR A MICROMECHANICAL COMPONENT AND MICROMECHANICAL COMPONENT

(71) Applicant: Robert Bosch GmbH, Stuttgart (DE)

(72) Inventors: Friedjof Heuck, Stuttgart (DE); Christoph Schelling, Stuttgart (DE); Mirko Hattass, Stuttgart (DE); Benjamin Schmidt, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 52 days.

(21) Appl. No.: 14/052,812

(22) Filed: Oct. 14, 2013

(65) Prior Publication Data

US 2014/0103497 A1 Apr. 17, 2014

(30) Foreign Application Priority Data

Oct. 16, 2012 (DE) ......................... 10 2012 218 845

(51) Int. Cl.
*B81C 1/00* (2006.01)
*G01C 19/5769* (2012.01)

(52) U.S. Cl.
CPC ......... *B81C 1/00531* (2013.01); *B81C 1/00595* (2013.01); *B81C 1/00619* (2013.01); *G01C 19/5769* (2013.01); *B81B 2201/0242* (2013.01); *B81C 2201/0132* (2013.01); *B81C 2201/0133* (2013.01)

(58) Field of Classification Search
CPC ............ B81C 1/00555; B81C 1/00595; B81C 1/00539
See application file for complete search history.

(56) References Cited

U.S. PATENT DOCUMENTS

| | | | | |
|---|---|---|---|---|
| 4,017,885 | A * | 4/1977 | Kendall et al. | 257/534 |
| 4,253,230 | A * | 3/1981 | Davis | 438/2 |
| 5,592,736 | A * | 1/1997 | Akram et al. | 29/841 |
| 5,705,321 | A * | 1/1998 | Brueck et al. | 430/316 |
| 5,883,012 | A * | 3/1999 | Chiou et al. | 438/748 |
| 6,787,052 | B1 * | 9/2004 | Vaganov | 216/57 |
| 8,440,546 | B2 * | 5/2013 | Nuzzo et al. | 438/472 |
| 2009/0008749 | A1 * | 1/2009 | Kaelberer et al. | 257/627 |
| 2012/0060244 | A1 * | 3/2012 | Poddar et al. | 850/56 |

OTHER PUBLICATIONS

Spezielle Herstellungsverfahren der Mikrosystemtechnik (Special Production Processes of Microsystems Technology); Ferienakademie 2004—Kurs 8; 45 Pages.

* cited by examiner

*Primary Examiner* — Michael Lebentritt
*Assistant Examiner* — Jordan Klein
(74) *Attorney, Agent, or Firm* — Maginot, Moore & Beck LLP

(57) ABSTRACT

A production process for a micromechanical component includes at least partially structuring at least one structure from at least one monocrystalline silicon layer by at least performing a crystal-orientation-dependent etching step on an upper side of the silicon layer with a given (110) surface orientation of the silicon layer. For the at least partial structuring of the at least one structure, at least one crystal-orientation-independent etching step is additionally performed on the upper side of the silicon layer with the given (110) surface orientation of the silicon layer.

13 Claims, 6 Drawing Sheets

10

PRODUCTION PROCESS FOR A MICROMECHANICAL COMPONENT AND MICROMECHANICAL COMPONENT

This application claims priority under 35 U.S.C. §119 to patent application no. DE 10 2012 218 845.2, filed on Oct. 16, 2012 in Germany, the disclosure of which is incorporated herein by reference in its entirety.

BACKGROUND

The disclosure relates to a production process for a micromechanical component. The disclosure also relates to a micromechanical component.

In the publication "Spezielle Herstellungsverfahren der Mikrosystemtechnik" [Special production processes of microsystems technology] (http://www.leb.eei.uni-erlangen.de/termine/ferienakademie/2008/mikrosysteme/Hoehne_SpezifischeVerfa hren_Vortrag.pdf; page 20), a process for forming perpendicular trenches into an upper side of a monocrystalline silicon wafer with a given (110) surface orientation by means of a crystal-orientation-dependent etching step is presented. The (111) crystal planes act there as etching resist planes.

SUMMARY

The present disclosure provides a production process for a micromechanical component with the features described below and a micromechanical component with the features described below.

The present disclosure makes it possible to mass produce a micromechanical component with a high yield, while at the same time ensuring that a desired structuring accuracy or structure flank symmetry of individual component parts is reliably maintained.

The use of monocrystalline/single-crystalline silicon allows grain effects that occur when structuring polycrystalline silicon to be suppressed. While the presence of grains in polycrystalline silicon often leads to inaccuracies in structuring, it is possible by means of the present disclosure for the well-defined crystal planes that occur in the monocrystalline silicon to be used for creating an advantageous form of the at least one structure that is structured from the monocrystalline silicon.

Preferably, a highly precisely oriented silicon layer that has a misorientation of less than 0.05°, in particular less than 0.02°, from the (110) crystal plane is provided for performing the production process, so that at least one highly symmetrical structure flank and/or at least one highly symmetrical side wall are structured as the at least one structure by means of at least the crystal-orientation-dependent etching step and the crystal-orientation-independent etching step. Providing the monocrystalline silicon layer with a surface that has a misorientation of less than ±0.5° from the (110) crystal plane and performing a crystal-orientation-dependent etching step on the upper side of this monocrystalline silicon layer allow misorientation angle tolerances occurring in the production process (that is the angular deviation of two opposing structure flanks from one another and the progression of this angular deviation over a substrate) to be advantageously kept at a low level. For example, it is possible with the production process according to the disclosure to bring down the misorientation angle tolerances to less than 0.5°, in particular less than ±0.02°, over an entire wafer. This is an advantageously low value in comparison with the misorientation angle tolerances that often occur system-dependently in a dry etching or deep structuring operation of at least ±0.5°. For example, the highly precisely (110)-oriented silicon layer may be provided as a component layer of an SOI substrate with a carrier wafer of any desired orientation. The disclosure can consequently be realized by means of a comparatively low-cost material.

Furthermore, an azimuthal crystal orientation of the silicon layer can be derived by a crystal-direction-dependent test etching of adjustment structures, and an azimuthal orientation of the lithography mask on the crystal can be derived with the aid of the derived crystal orientation for the crystal-direction-dependent etching step for the structuring of the at least one structure. The production process according to the disclosure can consequently be easily performed.

In an advantageous embodiment of the production process, an anisotropic etching step is performed as the at least one crystal-orientation-independent etching step. By means of an anisotropic etching step, even (111) crystal planes that are not perpendicular to the surface and lead to anisotropic etching in the case of a crystal-orientation-dependent etching step as (111) etching resist planes can be etched/cut through. The anisotropic etching step can consequently be used to eliminate undesired effects of the crystal-orientation-dependent etching step performed before or after it.

In particular, a deep reactive-ion etching step may be performed as the at least one crystal-orientation-independent etching step. A deep reactive-ion etching step can be easily combined with a crystal-orientation-dependent etching step.

In an advantageous embodiment, the at least one crystal-orientation-independent etching step is performed before the crystal-orientation-dependent etching step. However, the feasibility of performing the production process is not limited to such a sequence of the etching steps. For example, the crystal-orientation-dependent etching step may also be performed before the at least one crystal-orientation-independent etching step or between at least two crystal-orientation-independent etching steps.

In a preferred embodiment, at least one trench is etched by means of the crystal-orientation-independent etching step into the silicon layer through at least one region of a (111) etching resist plane that at least locally retards the crystal-orientation-dependent etching step.

In particular, in this case the at least one trench can be etched by means of the crystal-orientation-independent etching step into the silicon layer through the at least one region of a (111) etching resist plane that at least locally retards the crystal-orientation-dependent etching step with an orientation inclined by 35° in relation to the (110) crystal plane of the silicon layer. The production process described here consequently ensures advantageous use of the two (111) etching resist planes oriented perpendicularly to the (110) crystal plane, in particular for the etching of narrow trenches oriented perpendicularly to the (110) crystal plane with a high degree of accuracy, while the undesired effects of the further (111) etching resist planes can be suppressed. In this way, more accurate structuring of single-crystalline silicon is possible by means of the present disclosure. In particular, it is possible in this way to produce narrow trenches with an aspect ratio of greater than 1:1 (depth:width).

In a further advantageous embodiment, a wet-chemical etching step is performed as the at least one crystal-orientation-dependent etching step. A wet-chemical etching step can be easily performed and ensures the advantageous utilization of the (111) crystal planes oriented perpendicularly to the (110) crystal plane of the monocrystalline silicon as (111) etching resist planes. Furthermore, a wet-chemical etching step can be combined in a simple way with the at least one crystal-orientation-independent etching step, in particular with a deep reactive-ion etching step.

In a further advantageous embodiment, at least a partial region of a mount and/or a relay mechanism, with at least one freestanding element attached thereto, is structured from the monocrystalline silicon layer as the at least one structure. For example, at least one spring may be structured from the monocrystalline silicon layer as the at least one freestanding element attached to at least the partial region of the mount and/or the relay mechanism. The production process can consequently be used for the production of actuators and/or sensors requiring a high degree of structure accuracy and in particular side wall symmetry. In particular, the production process according to the disclosure may be used in the case of rotation-rate sensors for producing suspension spring structures with a symmetrical spring cross section and negligible flank misorientation angle with respect to side flanks.

A mount may be understood as meaning a structure that is structured from the monocrystalline silicon layer and is connected (almost) solidly and rigidly to the non-structured material and/or a substrate. By contrast, the relay mechanism should preferably be understood as meaning a structure that is structured from the monocrystalline silicon layer and can be adjusted (with it) and/or can be bent (with it). For example, the relay mechanism may be understood as meaning a structure that is structured from the monocrystalline silicon layer and by way of which two freestanding structures, such as for example springs, are connected to one another.

In a preferred embodiment, at least one hammerhead-shaped structure is formed, by way of which the at least one freestanding element goes over into at least the partial region of the mount and/or the relay mechanism. As explained more specifically below, in this way the position of the two (111) etching resist planes oriented perpendicularly to the (110) crystal plane can be advantageously utilized.

This can be understood as meaning that the at least one freestanding element is formed with an end contacting at least the partial region of the mount and/or the relay mechanism that has a first side face and a second side face, which are oriented perpendicularly to the (110) crystal plane of the silicon layer and which are oriented with respect to a side wall at least of the partial region of the mount and/or the relay mechanism that is oriented in relation to the respective freestanding element such that the first side face is inclined in relation to the side wall with an acute angle of inclination and the second side face is inclined in relation to the side wall with an obtuse angle of inclination.

The advantages described in the paragraphs above are also ensured in the case of a corresponding micromechanical component. The micromechanical component can also be developed in a way corresponding to the embodiments explained above.

BRIEF DESCRIPTION OF THE DRAWINGS

Further features and advantages of the present disclosure are explained below on the basis of the figures, in which.

DETAILED DESCRIPTION

FIGS. 1A to 1F show plan views of a silicon layer for explaining an embodiment of the production process.

Figure 1A:
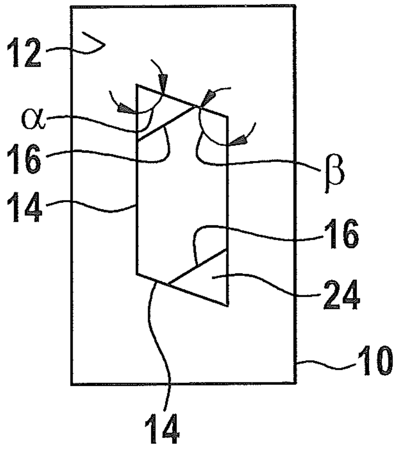
FIGS. 1A to 1F show plan views of a silicon layer for explaining an embodiment of the production process.

The silicon layer 10 represented in plan view in FIG. 1A is a monocrystalline silicon layer. The silicon layer 10 may, for example, be a layer of an SOI wafer. Similarly, a silicon wafer may also be used as the silicon layer 10. The (highly precisely (110)-oriented) silicon layer 10 may also be provided as a component layer of an SOI substrate with a carrier wafer of any desired orientation. The silicon layer 10 has a subsequently structured upper side 12 (outer side), which preferably has a misorientation of less than 0.05°, in particular less than 0.02°, from the (110) crystal plane. The silicon layer 10 can therefore be referred to as a highly precisely oriented silicon layer 10. For the sake of simplicity, this feature is described hereinafter by saying that the upper side 12 (outer side) is the (110) crystal plane 12. This may also be described as the silicon layer 10 being in (110) surface orientation. Similarly, the silicon layer 10 can be referred to as a monocrystalline (110) silicon layer 10.

The silicon layer 10 has two (111) crystal planes 14 that are aligned perpendicularly to the (110) crystal plane 12, which are schematically reproduced in FIG. 1A by means of their section axes. The two (111) crystal planes 14 aligned perpendicularly to the (110) crystal plane 12 are oriented in relation to one another at an acute angle $\alpha$ of (approximately) 70 and an obtuse angle $\beta$ of (approximately) 109. Two further (111) crystal planes 16 are oriented such that they are inclined by (approximately) 35 in relation to the (110) crystal plane 12 of the silicon layer.

By means of the production process described below, at least one highly symmetrical structure flank and/or at least one highly symmetrical side wall can be structured as at least one structure from the monocrystalline (110) silicon layer 10. In an optional process step, an azimuthal crystal orientation of the silicon layer 10 may be derived in advance by a crystal-direction-dependent test etching of adjustment structures and an azimuthal orientation of the lithography mask on the crystal can be derived in advance with the aid of the derived crystal orientation for the crystal-direction-dependent etching step for the structuring of the at least one structure.

Figure 1B:
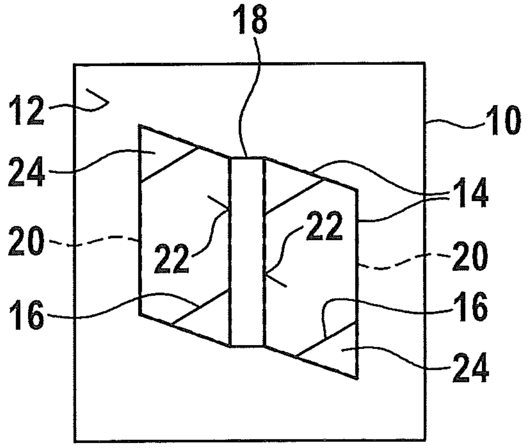

FIG. 1B shows a preferred position 18 of a structure to be structured from the silicon layer 10 by the performance of the production process described below. Merely by way of example, at least a partial region of a mount with at least one freestanding element attached thereto is structured from the monocrystalline silicon layer 10 as the at least one structure. The representation of the at least one freestanding element attached to at least the partial region of the mount as at least one spring, or a spring hanger, that is structured from the monocrystalline silicon layer also serves only for better illustration of the process described below. It is pointed out that a multiplicity of differently formed structures can be at least partially structured from the silicon layer 10 by means of the production process described below.

For the at least partial structuring of the at least one structure in the desired position 18, regions 20 of the silicon layer 10 have to be removed. This takes place in the case of the production process described here by performing a crystal-orientation-dependent etching step on the upper side 12 of the silicon layer 10 with the given (110) surface orientation of the silicon layer 10 and by additionally performing at least one crystal-orientation-independent etching step on the upper side 12 of the silicon layer 10 with the given (110) surface orientation of the silicon layer 10. During the crystal-orientation-dependent etching step, the two (111) crystal planes 14 oriented perpendicularly to the (110) crystal plane 12 may be used as etching resist planes for forming walls 22 oriented perpendicularly to the (110) crystal plane 12. However, when a crystal-orientation-dependent etching step is used, conventionally "shadowing effects" often occur on account of the further (111) crystal planes 16 oriented such that they are inclined by (approximately) 35° in relation to the (110) crystal plane 12. This can also be described by saying that the further (111) crystal planes 16 oriented such that they are inclined by (approximately) 35° in relation to the (110) crystal plane 12 locally resist/delimit the desired etching process as undesired (111) etching resist planes. This may in particular lead to the effect that undesired remnants 24 remain after the performance of the crystal-orientation-dependent etching step.

The crystal-orientation-dependent etching step may in particular be a wet-chemical etching step. For example, KOH may be used for performing the crystal-orientation-dependent etching step. A wet-chemical etching process has an extremely high selectivity with respect to the (111) crystal planes 14 oriented perpendicularly to the (110) crystal plane 12 as etching resist planes. On account of the high selectivity, the (111) crystal planes 14 oriented perpendicularly to the (110) crystal plane 12 are scarcely etched/not etched during the wet-chemical etching step. Therefore, perpendicularly oriented side walls can be structured from the (110) crystal plane 12 of the monocrystalline silicon layer 10 by means of the wet-chemical etching process. The misorientation angle occurring in the case of the wet-chemical etching process is mainly defined by a precise setting of the (110) surface 12. In this case, a misorientation angle of below 0.01° is generally ensured.

Further advantages of wet-chemical structuring are a greatly simplified construction of the etching chamber, and a very high degree of homogeneity of the etching rate over an entire surface area of the silicon layer 10. In the case of a wet etching process, there is also no occurrence of flank asymmetries that are caused by angled ion incidence over the wafer in the case of dry plasma etching. Furthermore, in the case of a wet etching process, it is possible to work with thinner maskings. Etching resists and transitions are better defined in the case of wet-chemical etching than in the case of dry etching. Furthermore, batch processing of wafers is possible, which is advantageous in comparison with single-wafer processing in the dry etcher.

If the crystal-orientation-dependent etching step comprises wet-chemical etching with KOH, an etching mask 12 of a thin silicon dioxide layer and a silicon nitride layer lying thereover would be appropriate. These two layers can be produced in a conformal manner by thermal oxidation and subsequent LPCVD deposition.

Figure 1C:
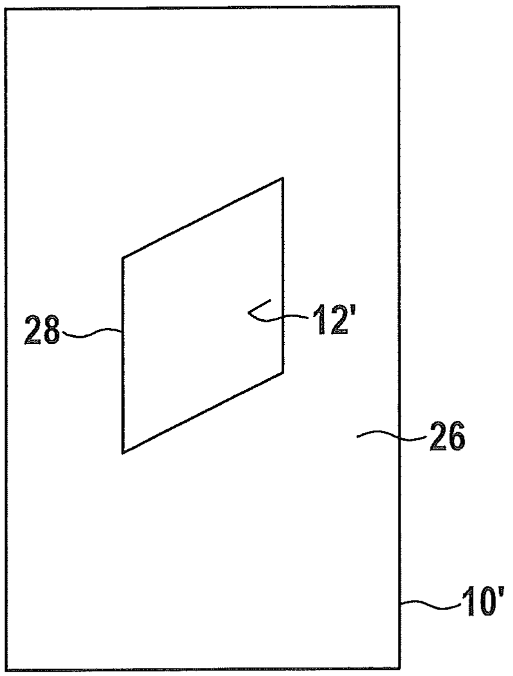
Figure 1C:
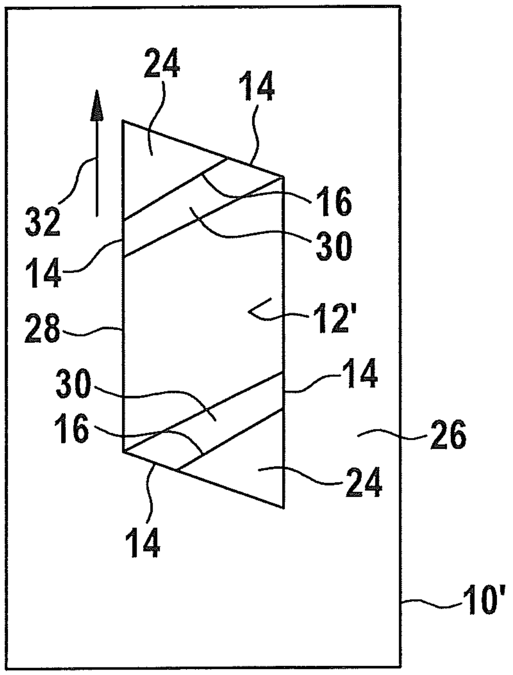

FIG. 1Ca and FIG. 1Cb show what would happen if it were attempted to remove the regions 20 (depicted in FIG. 1B) merely by a crystal-orientation-dependent etching step. (FIG. 1Ca and FIG. 1Cb consequently do not show performed process steps, but merely serve for understanding the process steps described further below.)

In FIG. 1Ca there is shown an etching mask 26 which has been applied to a comparison layer 10' corresponding to the silicon layer 10 and into which a through-opening 28 has been structured. The etching mask 26 has been applied to the (110) crystal plane 12' of the comparison layer 10'.

FIG. 1Cb shows a plan view of the corresponding location of the comparison layer 10' after performance of a crystal-orientation-dependent etching step. Performing the crystal-orientation-dependent etching step has had the effect of etching away the region of the comparison layer 10' that is exposed by means of the clearance 28 passing through the etching mask 26. In addition, however, further regions 30 of the comparison layer 10' lying under the etching mask 26 have also been etched away. These undercuts of the etching mask 26, depicted by means of the arrow 32, are delimited by the (111) crystal planes 14 and 16 acting as (111) etching resist planes. The delimitations of the (111) crystal planes 14 oriented perpendicularly to the (110) crystal plane 12' may be used for fixing a preferred form of the etching trench that is formed. However, the further (111) crystal planes 16, which are oriented such that they are inclined by an angle of (approximately) 35° in relation to the (110) crystal plane 12' of the comparison layer 10', bring about "shadowing effects" as undesired (111) etching resist planes. Consequently, the undesired (not etched-away) remnants 24 remain after the performance of the crystal-orientation-dependent etching step. The remnants 24 may lead to inaccuracies on the at least one structure that is structured by means of the crystal-orientation-dependent etching step. For example, the remnants 24 may conventionally bring about deviations in a structured form of a spring, whereby a spring constant of the spring deviates from a preferred value. It is explained hereafter how this disadvantage can be avoided by means of the process steps described below.

This undercutting of the etching mask shows that it is advantageous if, along with the precise setting of the (110) surface, there is also a highly precise orientation of the etching mask 26 on the (110) surface with respect to the perpendicular (111) planes. A misorientation of the etching mask 26 automatically leads to the effect that the desired structure width is reduced. The crystal orientation introduced into the Si substrates by the manufacturers is usually specified to within ±0.2°. This is sometimes scarcely adequate for the requirements aimed for here, and consequently additional steps, such as for example the forming of test structures that are structured with the crystal-orientation-dependent etching step, are often advantageous for the exact identification of the (111) plane orientation.

As already mentioned above, the production process described below also comprises the at least partial structuring of the at least one structure by additionally performing at least one crystal-orientation-independent etching step on the upper side 12 of the silicon layer 10 with the given (110) surface orientation of the silicon layer 10. This crystal-orientation-independent etching step is shown by FIG. 1D.

An anisotropic etching step, for example, may be performed as the at least one crystal-orientation-independent etching step. In a preferred way, a deep reactive-ion etching step is performed as the at least one crystal-orientation-independent etching step. In the case of the embodiment described here of the production process, the at least one crystal-orientation-independent etching step is performed before the crystal-orientation-dependent etching step. However, the feasibility of performing the production process is not limited to this sequence of the etching steps.

Figure 1D:
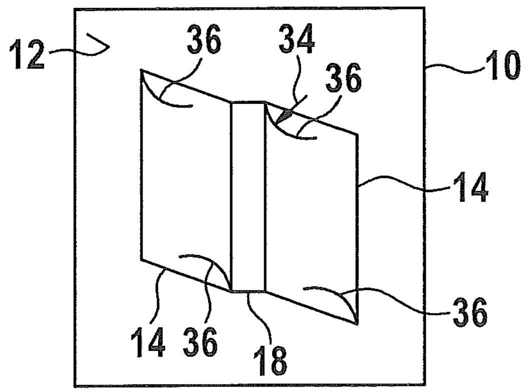

One possibility for reducing the influence of the undesired skewed (111) etching resist planes is to etch by means of the crystal-orientation-independent etching step represented in FIG. 1D at least one trench 34 into the silicon layer 10 through at least one region 36 of a (111) etching resist plane 14 or 16 that at least locally retards the crystal-orientation-dependent etching step. In particular, at least one trench 34 may be etched by means of the crystal-orientation-independent etching step into the silicon layer 10 through at least one region 36 of a (111) etching resist plane 16 that at least locally retards the crystal-orientation-dependent etching step with an orientation inclined by (approximately) 35° in relation to the (110) crystal plane 12 of the silicon layer 10. The crystal-orientation-independent etching step can therefore also be described as a cutting open of a "skewed" (111) etching resist plane 16. In this way, quickly etching planes can be exposed in a subsequent crystal-orientation-dependent etching, whereby the cut-through "skewed" (111) crystal planes 16 lose their effect as (111) etching resist planes. The position and/or orientation of the at least one trench 34 etched by means of the crystal-orientation-independent etching step can be fixed in particular such that the (111) crystal planes 14 oriented perpendicularly to the (110) crystal plane 12 retain their desired effect as (111) etching resist planes.

The performance of the at least one crystal-orientation-independent etching step with subsequent crystal-orientation-dependent etching has the advantage that it is possible to dispense with further preceding etching steps. It is consequently generally sufficient merely to perform a single crystal-orientation-independent etching step.

Figure 1E:
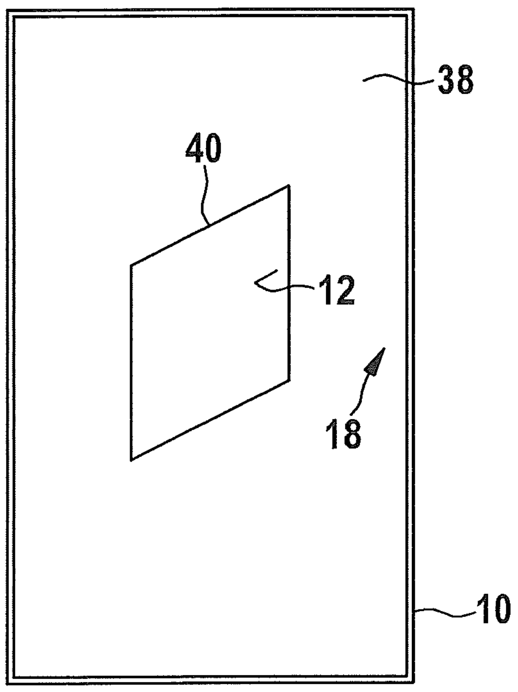

FIGS. 1E and F describe a further possibility for reducing the influence of the undesired skewed (111) etching resist planes. In this case, first the silicon layer 10 is structured by means of a crystal-independent process. The geometry of the surface area thereby left over deliberately deviates from the parallelogram-like opening in the etching mask. Instead, the convex point of intersection of the two (111) crystal planes 14 oriented perpendicularly to the (110) crystal plane 12 can be pushed into the pre-structured region by means of the clearance 40 formed so as to pass through the etching mask 38. Since this region has been structured in advance, the undesired skewed (111) etching resist planes cannot form during the crystal-orientation-dependent structuring process.

Figure 1F:
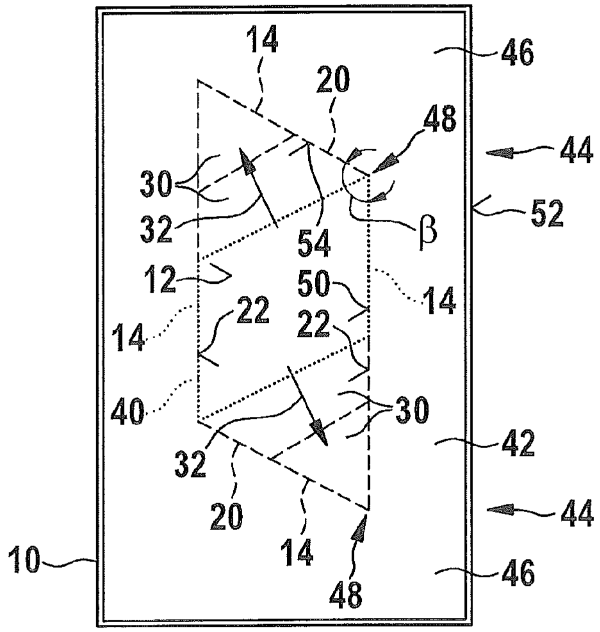

FIG. 1F shows the structure that has been structured from the (110) crystal plane 12 of the silicon layer 10 as a spring 42, which is clamped on a partial region 46 of the mount that has likewise been structured from the silicon layer 10. It is pointed out that a spring stiffness of the spring 42 can be fixed within a comparatively small range of deviation by means of the production process described here. However, the production process described here is suitable not only for the structuring of the spring 42.

When structuring the spring 42 and the partial region 46 of the mount by means of the process described here, not only is the region of the silicon layer 10 that has been exposed by means of the clearance 40 in the etching mask 38 etched away, but there is also the undercutting 32 described above for the removal of further regions 30 lying under the etching mask 26. However, the conventional restrictions in the structuring of the silicon layer 10 do not apply to the undercutting 32. On account of the previously performed crystal-orientation-independent etching step, the "skewed", "cut-open" (111) crystal planes 16 do not act as (111) etching resist planes during the crystal-orientation-dependent etching step that is reproduced in FIG. 1F.

As can be seen in FIG. 1F, the (111) crystal planes 14 oriented perpendicularly to the (110) crystal plane 12 can be used in the case of the process described here for structuring walls 22 of the spring 42 and of the partial region 46 that are oriented perpendicularly to the surface 12. The walls 22 can be oriented exactly in two directions, the two directions being fixed by the (111) etching resist planes 14 running perpendicularly to the (110) crystal plane 12.

To sum up, an advantageous accuracy in the structuring of the silicon layer 10 is consequently ensured by the combination of the crystal-orientation-independent etching step with the crystal-orientation-dependent etching step. In a preferred way, the regions that are sensitive to production tolerances are thereby etched crystal-orientation-dependently. The other regions can be structured by means of the crystal-orientation-independent etching step such that the two regions combine to form an advantageous overall configuration.

As can be seen from FIG. 1F, in the case of the production process described here at least one hammerhead-shaped structure 44 is formed, by way of which the freestanding element formed as a spring 42 goes over into at least the partial region 46 of the mount. This can also be described by saying that the at least one freestanding element formed as a spring 42 is formed with an end 48 contacting at least the partial region 46 of the mount that has a first side face 50 and a second side face 52, which are oriented perpendicularly to the (110) crystal plane 12 of the silicon layer 10. The side faces 50 and 52 are oriented with respect to a side wall 54 at least of the partial region 46 of the mount that is oriented in relation to the respective freestanding element such that the first side face 50 is inclined in relation to the side wall 54 with an acute angle of inclination $\alpha$ (not depicted), which may in particular be approximately 70°. The second side face 52 may be inclined in relation to the side wall 54 with an obtuse angle of inclination $\beta$, which may in particular be approximately 109°. The further details and advantages of the attachment realized in this way of the at least one freestanding element to at least the partial region 46 of the mount are discussed more specifically below. (The comments made above with respect to the hammerhead-shaped structure 44 also apply correspondingly, as long as the spring 42 or a freestanding element of some other form are connected by way of the structure to a relay mechanism.)

The production process described above may be performed in particular for producing an actuator or a sensor, such as for example an acceleration sensor and/or a rotation-rate sensor. However, other micromechanical components may also be produced by means of the production process.

In the case of an alternative embodiment of the production process, the crystal-orientation-dependent etching step is performed before the crystal-orientation-independent etching step. In particular when performing a deep reactive-ion etching step as the crystal-orientation-independent etching step, this has the advantage that the partial structures that are structured by means of the crystal-orientation-dependent etching step only have to be protected by a thin masking for the performance of the crystal-orientation-independent etching step. In the case of a deep reactive-ion etching step, the structuring is brought about (mainly) by a physical ion bombardment directed perpendicularly to the surface 12. Consequently, in the case of a deep reactive-ion etching step, a thin silicon dioxide layer, for example with a layer thickness of 50 nm, on the side walls is sufficient as masking. Such a silicon dioxide layer can for example be formed by a thermal oxidation inexpensively and on the basis of an established process.

Optionally, a smoothing and orientation of the partial structures that are structured by means of the crystal-orientation-independent etching step on the (111) crystal planes may also be performed. In this case, first the crystal-orientation-independent etching step is performed. Subsequently, no masking is deposited, but the rough partial structure created by the structuring and having relatively great error tolerances is smoothed by a crystal-orientation-dependent etching as far as the (111) crystal planes 14. After that, the smoothed structures are protected by a thin silicon dioxide layer. Subsequently, the remaining configuration elements can be formed by means of a further crystal-orientation-independent etching step.

Figure 2A:
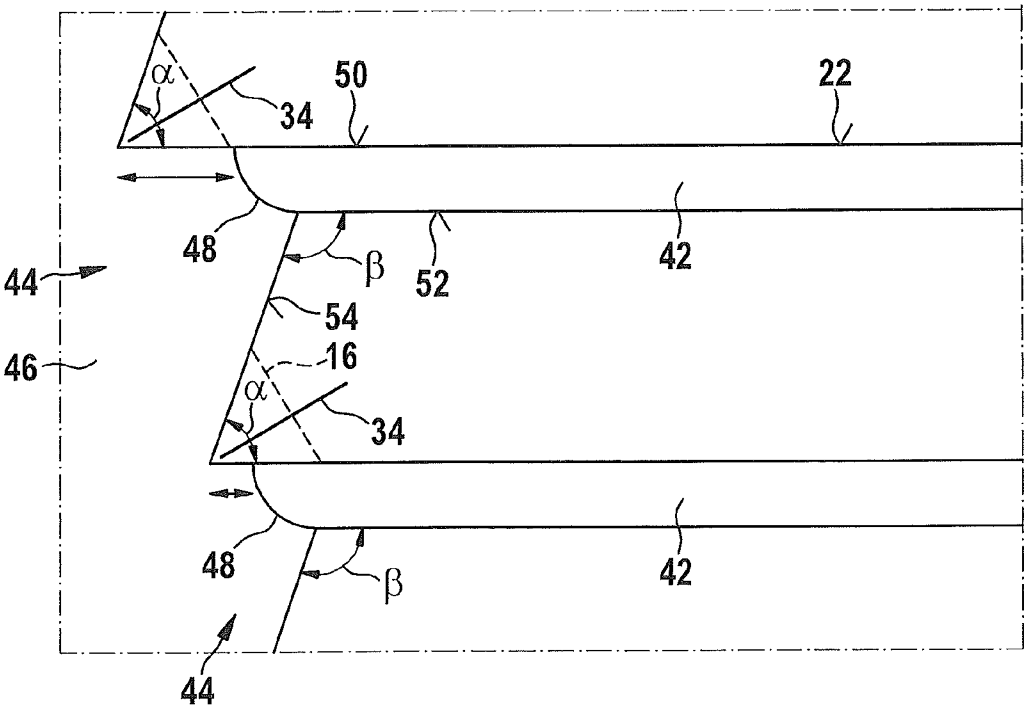
FIGS. 2A and 2B show schematic partial representations of a first embodiment of the micromechanical component.
Figure 2B:
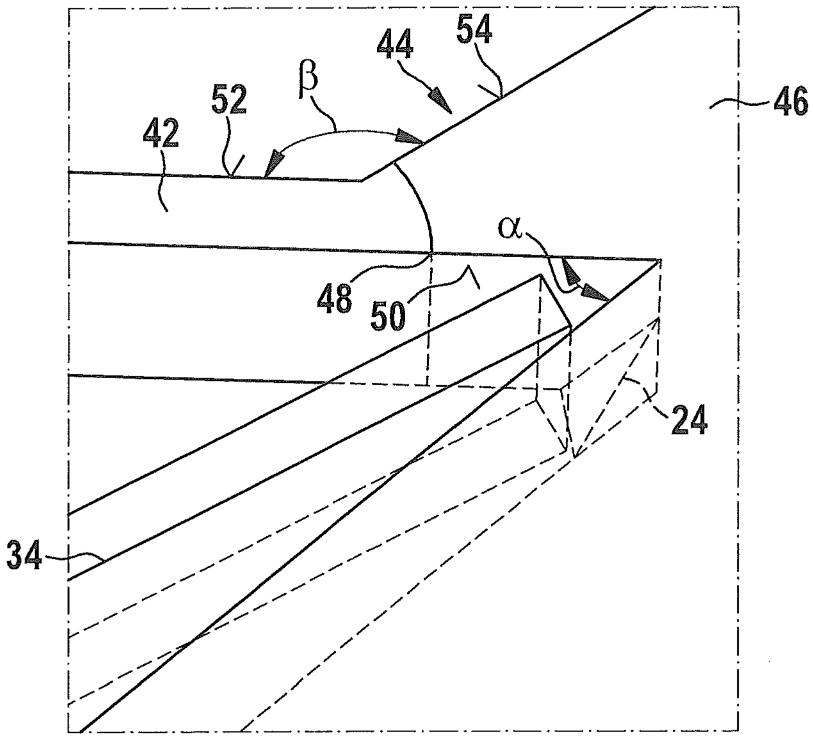

FIGS. 2A and 2B show schematic partial representations of a first embodiment of the micromechanical component.

The micromechanical component schematically represented in FIGS. 2A and 2B has been produced by means of the production process set out above. The micromechanical component has at least one structure 42 and 46, which has been structured from at least one monocrystalline silicon layer and comprises at least a partial region 46 of a mount with at least one freestanding element 42 attached thereto. For example, the at least one freestanding element 42 attached to at least the partial region 46 of the mount is at least one spring 42.

The at least one freestanding element 42 goes over via a hammerhead-shaped structure 44 into at least the partial region 46 of the mount, which offsets adjustment tolerances between the crystal-orientation-dependent etching step and the crystal-orientation-independent etching step. This is preferably understood as meaning that the at least one freestanding element 42 has at an end 48 contacting at least the partial region 46 of the mount a first side face 50 and a second side face 52, which are oriented perpendicularly to the (110) crystal plane of the (previous) silicon layer and are oriented with respect to a side wall 54 (of the partial region 46 of the mount) that is oriented in relation to the respective freestanding element 42 such that the first side face 50 is inclined in relation to the side wall 54 with an acute angle of inclination $\alpha$ and the second side face 52 is inclined in relation to the side wall 54 with an obtuse angle of inclination $\beta$. This attachment of the freestanding element 42 to at least the partial region 46 of the mount may also be described as a hammerhead transition. The hammerhead-shaped structure 44 may also be described by saying that, at the end of the freestanding element 42 extending along a longitudinal direction, a first edge with the acute angle of inclination $\alpha$ is offset with respect to a second edge with the obtuse angle of inclination $\beta$ with reference to the longitudinal direction. For example, the second edge with the obtuse angle of inclination $\beta$ lies closer to a center point/center of gravity of the freestanding element 42 than the first edge with the acute angle of inclination $\alpha$.

The acute angle of inclination $\alpha$ preferably lies in a range between 80° and 60°, with preference in a range between 75° and 65°. The acute angle of inclination $\alpha$ may in particular be approximately 70. Correspondingly, the obtuse angle of inclination $\beta$ preferably lies in a range between 100° and 120°, with preference between 105° and 115°. The obtuse angle of inclination $\beta$ may in particular be approximately 109°. It is clearly evident from such angles of inclination $\alpha$ and $\beta$ that the structures 42 and 46 have been structured from the monocrystalline silicon by means of the production process described above. (This is also evident from the fact that the side faces 50 and 52 are the (111) crystal planes 14 oriented perpendicularly to the (110) crystal plane 12.)

In addition, it may be evident from the micromechanical component that a (111) crystal plane 16 (not depicted) oriented such that it is inclined by an angle of (approximately) 35° in relation to the (110) crystal plane has been etched through by means of a trench 34, which has been etched in particular by means of a deep reactive-ion etching step. In this way it can be ensured that at most a comparatively small remnant 24 remains after the structuring of the structures 42 and 46. In particular in a region that is important for adjusting and/or bending characteristics of the at least one freestanding element 42, the desired structure 42 and 46 can consequently be structured with a high degree of accuracy. Consequently, in this region specifically, low production tolerances are ensured.

The angles of inclination $\alpha$ and $\beta$ cause the width of the freestanding element 42 formed as a spring to increase greatly. Since the spring stiffness of the spring 42 increases with the spring width by a power of three, the mechanical transition between the flexible spring 42 and the mechanically stiff hammerhead-shaped structure 44 is displaced only very little. Consequently, the distance between the acute angle of inclination $\alpha$ and the mechanical transition can be chosen such that the increased tolerances within this region are offset. By contrast with the region with the acute angle of inclination $\alpha$, the notch stresses of the great angle of inclination $\beta$ are comparatively small. Consequently, the micromechanical component produced can withstand mechanical loading.

Furthermore, in the case of the micromechanical component it is possible to offset the influence of the increased error tolerances at the interface of the two (111) crystal planes 14. Since this interface possibly lies in the anchoring of the spring 42, and the greatest mechanical stresses occur there, increased tolerances have a disproportionate effect on the cross-sectional symmetry of the spring and the mechanical load-bearing capacity. However, this problem can be obviated by the acute angle of inclination $\alpha$ of the (111) crystal plane with low production tolerance being pulled out from this point.

The micromechanical component consequently has a configuration that reduces the influence of the increased tolerances on the cross-sectional symmetry of the spring on the basis of the cutting open of the skewed (111) crystal plane 16 by the subsequent crystal-orientation-dependent etching. Along with the increased cross-sectional symmetry of the spring, the notch stress at the acute angle of inclination of the perpendicular (111) crystal planes is also reduced. A further point is that high notch stresses are avoided by the angles of inclination and the only minimal rounding.

Figure 3A:
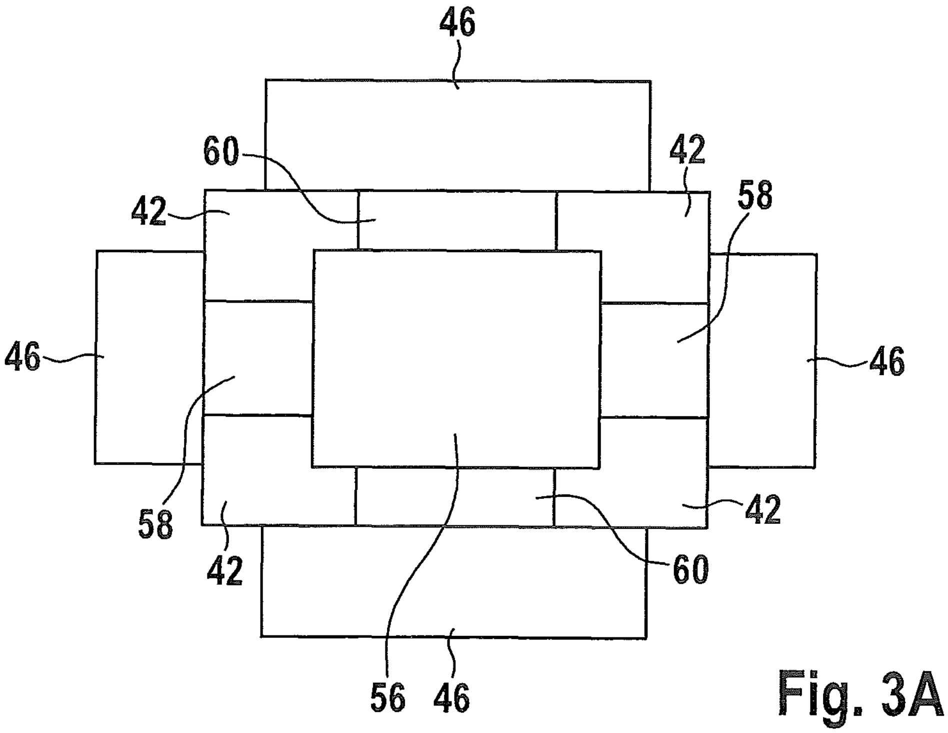
FIGS. 3A and 3B show a plan view and a cross section of a second embodiment of the micromechanical component.
Figure 3B:
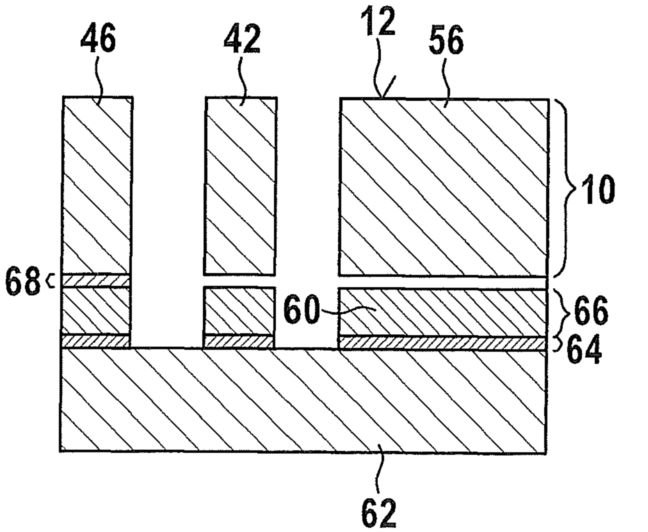

FIGS. 3A and 3B show a plan view and a cross section of a second embodiment of the micromechanical component.

The micromechanical component that is schematically reproduced in FIGS. 3A and 3B has also been produced by means of the production process set out above. The micromechanical component of FIGS. 3A and 3B is at least part of a rotation-rate sensor. For this purpose, the micromechanical component has a (seismic) mass 56, which can be set into a translational vibration within a plane and is suspended on at least a partial region 46 of a mount by way of springs 42. Electrode combs 58 are formed on the mount and the mass 56 as an actuator for setting the mass into the translational vibration.

As a result of the Coriolis force, a rotational movement of the rotation-rate sensor brings about a tipping of the vibrating mass 56 orthogonally in relation to the direction of driving and the axis of rotation. This tipping of the vibrating mass 56 can be measured by means of several detection electrodes 60, which are formed both on the mount and on the mass 56.

The micromechanical component may comprise a base substrate 62, on which an insulating layer 64, such as for example a silicon dioxide layer, has been applied. At least the insulating layer 64 in this case separates the base substrate 62 from a monocrystalline (remaining) silicon layer 10, the (remaining) upper side 12 of which, directed away from the base substrate, is the (110) crystal plane 12 of the monocrystalline (remaining) silicon layer 10. On the insulating layer 64 there may optionally lie a conductive layer 66, in which the detection electrodes 60 attached to the mount are formed. Part of the electronics of the rotation-rate sensor may also be formed in the conductive layer 66. If the conductive layer 66 is present, a further insulating layer 68, such as for example a silicon dioxide layer, separates the conductive layer 66 from the monocrystalline (remaining) silicon layer 10. To achieve the desired highly symmetrical structure flanks with a flank misorientation of less than 0.05° in respect of opposing flanks, it is advantageous if the boundary surface of the silicon layer 10 that is facing the base substrate 62 has a misorientation of less than 0.05° from a (110) crystal plane of the silicon.

The (remaining) silicon layer 10 may be connected to the further layers 62 to 68 by way of a bonding connection. The base substrate 62 may possibly also be removed by way of grinding back or chemical etching, so that only remnants thereof remain.

By means of the production process set out above, at least the springs 42 and the mass 56 can be structured from the monocrystalline (remaining) silicon layer 10. In this way, the tolerance-sensitive springs 42 can be produced with very narrow tolerances, while the less sensitive regions have wider tolerances.

The present disclosure is not restricted to a rotation-rate sensor. For example, the present disclosure may also be advantageously used for other inertial sensors or sensors with high requirements for their spring constants.

What is claimed is:

1. A production process for a micromechanical component, comprising:

at least partially structuring at least one structure from at least one monocrystalline silicon layer by at least performing crystal-orientation-dependent etching on an upper side of the silicon layer with a given (110) surface orientation of the silicon layer, wherein for the at least partial structuring of the at least one structure, at least one crystal-orientation-independent etching is additionally performed on the upper side of the silicon layer with the given (110) surface orientation of the silicon layer, and wherein a highly precisely-oriented silicon layer that has a misorientation of less than 0.05° from the (110) crystal plane is provided for performing the production process, such that at least one highly symmetrical structure flank and/or at least one highly symmetrical side wall are structured as the at least one structure by at least the crystal-orientation-dependent etching and the crystal-orientation-independent etching.

2. The production process according to claim 1, wherein the highly precisely (110)-oriented silicon layer is provided as a component layer of an SOI substrate with a carrier wafer of any desired orientation.

3. The production process according to claim 1, wherein the at least one crystal-orientation-independent etching is performed before the crystal-orientation-dependent etching.

4. The production process according to claim 3, further comprising etching at least one trench by the crystal-orientation-independent etching into the silicon layer through at least one region of a (111) etching resist plane that at least locally retards the crystal-orientation-dependent etching.

5. The production process according to claim 4, wherein the at least one trench is etched by the crystal-orientation-independent etching into the silicon layer through the at least one region of a (111) etching resist plane that at least locally retards the crystal-orientation-dependent etching with an orientation inclined by 35° in relation to the (110) crystal plane of the silicon layer.

6. The production process according to claim 1, wherein at least a partial region of a mount and/or a relay mechanism, with at least one freestanding element attached thereto, is structured from the monocrystalline silicon layer as the at least one structure.

7. The production process according to claim 6, wherein at least one spring is structured from the monocrystalline silicon layer as the at least one freestanding element attached to at least the partial region of the mount and/or the relay mechanism.

8. The production process according to claim 6, wherein at least one hammerhead-shaped structure is formed, the at least one hammerhead-shaped structure configured to enable the at least one freestanding element to go over into at least the partial region of the mount and/or the relay mechanism.

9. The production process according to claim 8, wherein:

the at least one freestanding element is formed with an end configured to contact at least the partial region of the mount and/or the relay mechanism that has a first side face and a second side face, and the first side face and the second side face are oriented perpendicularly to the (110) crystal plane of the silicon layer and are oriented with respect to a side wall at least of the partial region of the mount and/or the relay mechanism that is oriented in relation to the respective freestanding element such that the first side face is inclined in relation to the side wall with an acute angle of inclination and the second side face is inclined in relation to the side wall with an obtuse angle of inclination.

10. The production process according to claim 1, wherein the highly precisely oriented silicon layer has a misorientation of less than 0.02° from the (110) crystal plane.

11. A production process for a micromechanical component, comprising:

at least partially structuring at least one structure from at least one monocrystalline silicon layer by at least performing crystal-orientation-dependent etching on an upper side of the silicon layer with a given (110) surface orientation of the silicon layer, wherein for the at least partial structuring of the at least one structure, at least one crystal-orientation-independent etching is additionally performed on the upper side of the silicon layer with the given (110) surface orientation of the silicon layer, wherein deriving an azimuthal crystal orientation of the silicon layer by a crystal-direction-dependent test etching of adjustment structures, and wherein deriving an azimuthal orientation of the lithography mask on the crystal with the aid of the derived crystal orientation for the crystal-direction-dependent etching for the structuring of the at least one structure.

12. A production process for a micromechanical component, comprising:

at least partially structuring at least one structure from at least one monocrystalline silicon layer by at least performing crystal-orientation-dependent etching on an upper side of the silicon layer with a given (110) surface orientation of the silicon layer, wherein for the at least partial structuring of the at least one structure, at least one crystal-orientation-independent etching is additionally performed on the upper side of the silicon layer with the given (110) surface orientation of the silicon layer, and wherein an anisotropic etching is performed as the at least one crystal-orientation-independent etching.

13. The production process according to claim 12, wherein a deep reactive-ion etching is performed as the at least one crystal-orientation-independent etching.

* * * * *